(12) United States Patent
Araki et al.

(10) Patent No.: US 6,483,675 B1
(45) Date of Patent: *Nov. 19, 2002

(54) TUNNEL MAGNETORESISTANCE EFFECT ELEMENT

(75) Inventors: Satoru Araki, Tokyo (JP); Koji Shimazawa, Tokyo (JP); Haruyuki Morita, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/538,470

(22) Filed: Mar. 30, 2000

(30) Foreign Application Priority Data

Jul. 23, 1999 (JP) .............................. 11-208441

(51) Int. Cl.⁷ .............................. G11B 5/82; G11B 5/56
(52) U.S. Cl. ..................... 360/324.2; 428/141
(58) Field of Search .............................. 360/113, 324.1, 360/324.2, 324.11; 428/141, 694, 900; 338/32; 324/252

(56) References Cited

U.S. PATENT DOCUMENTS

| | | | |
|---|---|---|---|
| 5,366,815 A | 11/1994 | Araki et al. | 428/611 |
| 5,510,172 A | 4/1996 | Araki et al. | 428/213 |
| 5,514,452 A | 5/1996 | Araki et al. | 428/213 |
| 5,657,190 A | 8/1997 | Araki et al. | 428/213 |
| 5,661,449 A | 8/1997 | Araki et al. | 428/213 |
| 5,736,236 A | 4/1998 | Araki et al. | 428/213 |
| 5,751,521 A * | 5/1998 | Gill | 360/113 |
| 5,783,284 A | 7/1998 | Shinjo et al. | 428/213 |
| 5,789,069 A | 8/1998 | Araki et al. | 428/213 |
| 5,793,279 A * | 8/1998 | Nepela | 338/32 |
| 5,798,896 A | 8/1998 | Araki et al. | 428/213 |
| 5,801,984 A * | 9/1998 | Parkin | 365/158 |
| 5,862,022 A | 1/1999 | Noguchi et al. | 360/113 |
| 5,874,886 A | 2/1999 | Araki et al. | 428/213 |
| 5,949,622 A * | 9/1999 | Kamiguchi et al. | 360/113 |
| 5,968,676 A | 10/1999 | Araki et al. | 428/213 |
| 5,976,668 A * | 11/1999 | Chiba et al. | 428/141 |
| 6,004,654 A | 12/1999 | Shinjo et al. | 428/161 |
| 6,123,780 A * | 9/2000 | Kanai et al. | 148/108 |
| 6,180,957 B1 * | 1/2001 | Miyasaka et al. | 257/57 |
| 6,251,835 B1 * | 6/2001 | Chu et al. | |
| 6,256,178 B1 * | 7/2001 | Gill | 360/324.2 |
| 6,266,218 B1 * | 7/2001 | Carey et al. | 360/324.12 |
| 6,277,465 B1 * | 8/2001 | Watanabe et al. | 428/141 |
| 6,335,081 B1 * | 1/2002 | Araki et al. | 428/141 |

* cited by examiner

*Primary Examiner*—Hoa T. Nguyen
*Assistant Examiner*—Dzung C. Nguyen
(74) *Attorney, Agent, or Firm*—Oblon, Spivak, McClelland, Maier & Neustadt, P.C.

(57) ABSTRACT

In a tunnel magnetoresistance effect element comprising a tunnel multilayered film having a tunnel barrier layer, a ferromagnetic free layer and a ferromagnetic pinned layer such that the tunnel barrier layer is held between the ferromagnetic free layer and the ferromagnetic pinned layer, three indexes representing a surface roughness state of the tunnel barrier layer are set such that $Ra \leq 1$ nm, $Rmax \leq 10$ nm and $Rrms \leq 1.2$ nm, wherein Ra is one of the three indexes and representing the center line average roughness, Rmax is one of the three indexes and representing the maximum height, and Rrms is one of the three indexes and representing the standard deviation roughness. Thus, the tunnel magnetoresistance effect element exhibits improved characteristics, particularly, a large head output.

17 Claims, 3 Drawing Sheets

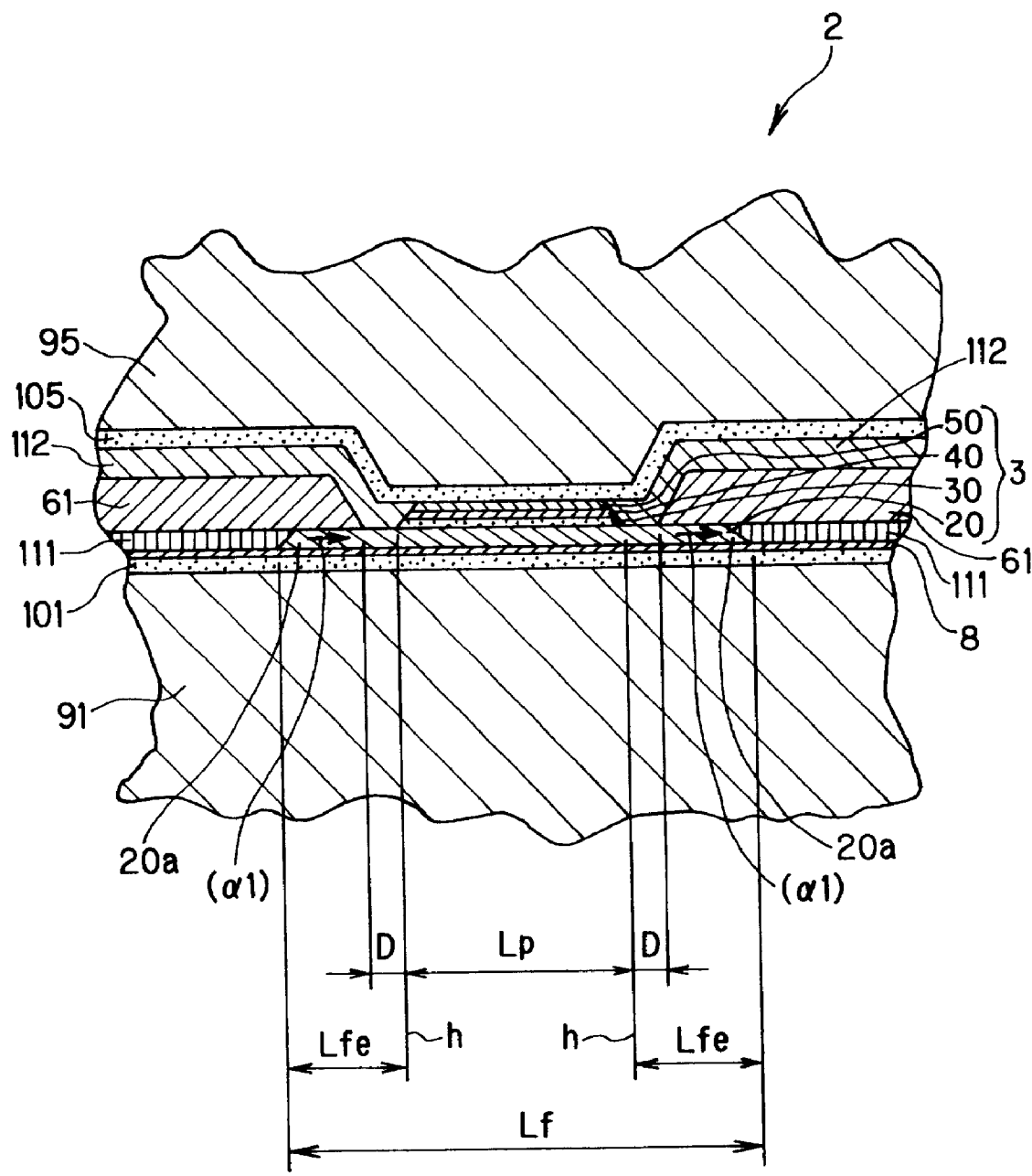

TUNNEL MAGNETORESISTANCE EFFECT ELEMENT

BACKGROUND OF THE INVENTION

1. Field of the Invention

The present invention relates to a tunnel magnetoresistance effect element. The ferromagnetic tunnel magnetoresistance effect element is, among magnetoresistance effect films for reading the magnetic field intensity of a magnetic recording medium or the like as a signal, an element which is capable of reading a small magnetic field change as a greater electrical resistance change signal. The ferromagnetic tunnel magnetoresistance effect element is mainly incorporated in, for example, a hard disk drive.

2. Description of the Related Art

Following the high densification of hard disks (HD), highly sensitive magnetic heads with high outputs have been demanded. In response to these demands, attention has been paid to a ferromagnetic tunnel magnetoresistance effect element having a multilayered structure composed of ferromagnetic layer/tunnel barrier layer/ferromagnetic layer, which utilizes a ferromagnetic tunnel magnetoresistance effect.

The ferromagnetic tunnel magnetoresistance effect is a phenomenon that when a current is applied in a laminate direction between a pair of ferromagnetic layers which sandwich a tunnel barrier layer, a tunnel current flowing in the tunnel barrier layer changes depending on a relative angle of magnetization between both ferromagnetic layers.

In this case, the tunnel barrier layer is a thin insulation film which allows electrons to pass therethrough while keeping spins of the electrons due to the tunnel magnetoresistance effect. Generally, the tunnel barrier layer is obtained by oxidizing a thin metal, such as Al, layer of about 10 Å in thickness.

When the relative angle of magnetization between both ferromagnetic layers which sandwich the tunnel barrier layer therebetween is decreased, the tunneling probability is increased and, therefore, the resistance to current flowing therebetween is decreased. In contrast, when the relative angle of magnetization between both ferromagnetic layers is large, the tunneling probability is lowered, thus, the resistance to current flowing therebetween is increased.

When applying the TMR element to a HDD head, it is essential to lower the electrical resistance of the element. The reason is as follows: Specifically, the resistance of a TMR element is basically expressed by the following equation (1).

$$R_\sigma = C_\sigma \exp(2\kappa d) \quad (1)$$

$$\kappa = (2m\phi/h^2)^{1/2}$$

wherein d represents a thickness of a barrier layer, $\phi$ represents a magnitude of a barrier potential measured from the Fermi level, and $C_\sigma$ represents an amount determined by an electron state of an insulation layer and magnetic layers, and may be considered to be an amount which is approximately proportional to the product of the Fermi levels of the two magnetic layers.

According to the forgoing equation (1), it is understood that lowering of the resistance of the element can be achieved by reducing the thickness d of the barrier layer. By reducing the resistance of the element, a larger current is allowed to supply, thus, a greater output can be achieved. In addition, in order to eliminate Electro-Static Discharges, it is desirable to lower the resistance of the element.

However, when decreasing the thickness d of the barrier layer, it is expected that the surface condition of the barrier layer should be highly smoother. When the surface is not smooth enough while the thickness of the barrier layer is thin, pinholes are apt to occur in a portion of the barrier layer, and a leakage current may occur through the pinholes. When the leakage current occurs, the greater output can not be achieved. Further, an output may not be obtained when an amount of leakage current is too large.

Under the foregoing circumstances, a feasibility study for realizing a tunnel magnetoresistance effect element including a head configuration has not been sufficiently achieved, though such a feasibility study is in the initial stage. Particularly, a standard specification for surface roughness of a tunnel barrier layer to significantly improve a head output has not been proposed.

The present invention has been made under these circumstances and has an object to provide a standard specification for a tunnel barrier layer to obtain improved characteristics of a tunnel magnetoresistance effect element, particularly to achieve a high head output.

SUMMARY OF THE INVENTION

For solving the foregoing problems, according to one aspect of the present invention, there is provided a tunnel magnetoresistance effect element comprising a tunnel multilayered film having a tunnel barrier layer, a ferromagnetic free layer and a ferromagnetic pinned layer such that the tunnel barrier layer is held between the ferromagnetic free layer and the ferromagnetic pinned layer, wherein three indexes representing a surface roughness state of the tunnel barrier layer are set such that $Ra \leq 1$ nm, $Rmax \leq 10$ nm and $Rrms \leq 1.2$ nm, wherein Ra is one of the three indexes and representing the center line average roughness, Rmax is one of the three indexes and representing the maximum height, and Rrms is one of the three indexes and representing the standard deviation roughness.

According to another aspect of the present invention, there is provided a magnet-resistive tunnel junction head comprising a tunnel magnetoresistance effect element which includes a tunnel multilayered film having a tunnel barrier layer, a ferromagnetic free layer and a ferromagnetic pinned layer such that the tunnel barrier layer is held between the ferromagnetic free layer and the ferromagnetic pinned layer, wherein three indexes representing a surface roughness state of the tunnel barrier layer are set such that $Ra \leq 1$ nm, $Rmax \leq 10$ nm and $Rrms \leq 1.2$ nm, wherein Ra is one of the three indexes and representing the center line average roughness, Rmax is one of the three indexes and representing the maximum height, and Rrms is one of the three indexes and representing the standard deviation roughness.

It is preferable that the center line average roughness Ra is set to be in the range of 0.001 nm to 1 nm, the maximum height Rmax is set to be in the range of 0.01 nm to 10 nm, and the standard deviation roughness Rrms is set to be in the range of 0.001 nm to 1.2 nm.

It is preferable that the tunnel magnetoresistance effect element comprises the ferromagnetic free layer, the tunnel barrier layer, the ferromagnetic pinned layer and a pinning layer for pinning magnetization of the ferromagnetic pinned layer, which are stacked, in the order named, on an under layer formed on a substrate.

It is preferable that the tunnel magnetoresistance effect element comprises a pinning layer for pinning magnetization of the ferromagnetic pinned layer, the ferromagnetic pinned layer, the tunnel barrier layer and the ferromagnetic free layer, which are stacked, in the order named, on an under layer formed on a substrate.

It is preferable that the surface of one of the layers which have been formed before forming the tunnel barrier layer is smoothed by a gas cluster ion beam method.

It is preferable that before forming the tunnel barrier layer, the surface of an under layer is smoothed by a gas cluster ion beam method.

It is preferable that a bias magnetic field is applied to the ferromagnetic free layer in a longitudinal direction thereof by biasing means provided at both ends of the ferromagnetic free layer in the longitudinal direction thereof.

It is preferable that the ferromagnetic free layer is a synthetic ferrimagnet.

It is preferable that the ferromagnetic pinned layer is a synthetic ferrimagnet.

It is preferable that the tunnel multilayered film is electrically connected to a pair of electrodes which are oppositely positioned to sandwich the tunnel multilayered film therebetween.

It is preferable that a pair of shield layers are oppositely positioned to sandwich the pair of electrodes therebetween.

BRIEF DESCRIPTION OF THE DRAWINGS

FIG. 3 is a sectional view showing an example wherein the ferromagnetic tunnel magnetoresistance effect element according to the present invention is applied to a magnetoresistive tunnel junction head.

DETAILED DESCRIPTION OF THE INVENTION

Hereinbelow, a tunnel magnetoresistance effect element 1 (hereinafter simply referred to as "TMR element") according to the present invention will be described in detail.

Figure 1:
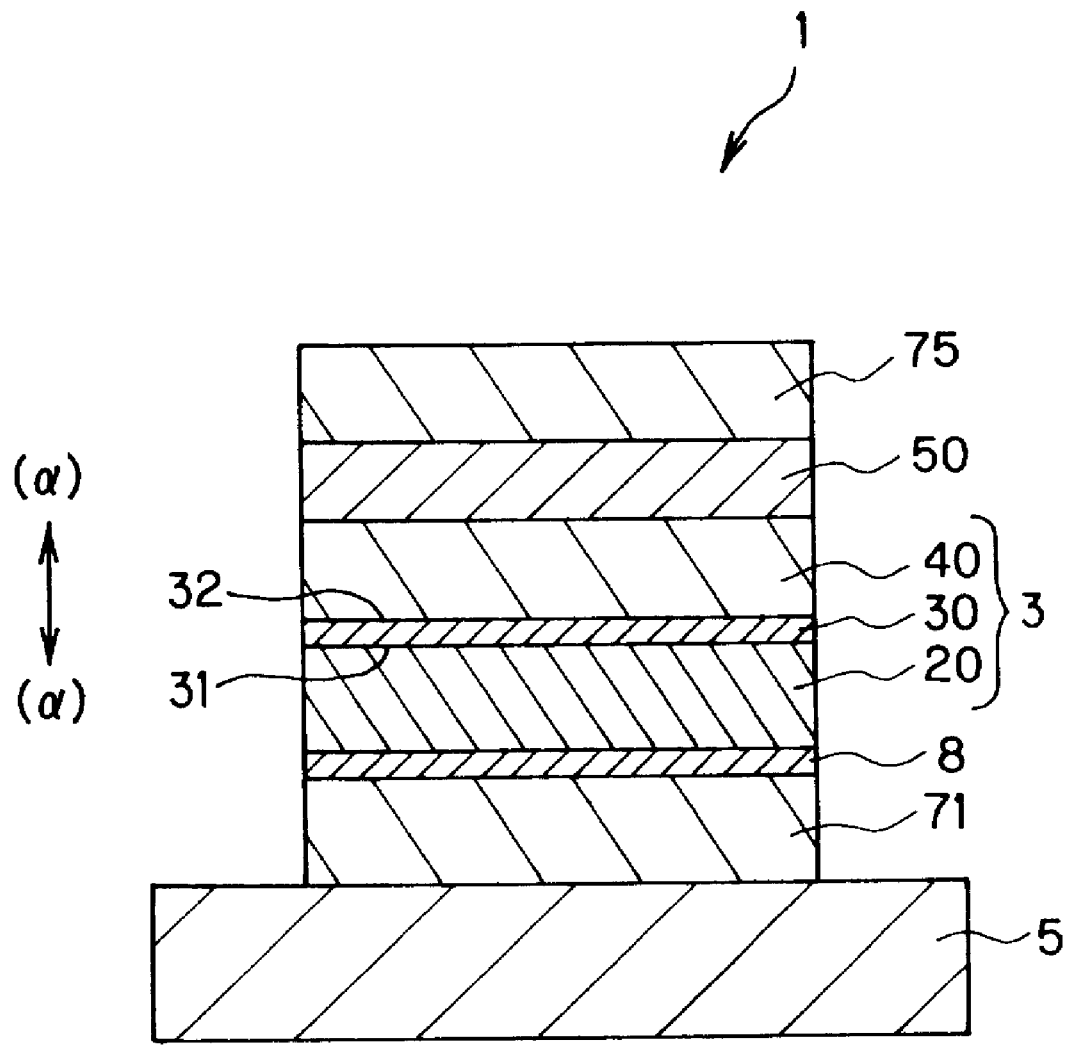
FIG. 1 is a sectional view of a ferromagnetic tunnel magnetoresistance effect element according to a preferred embodiment of the present invention.

FIG. 1 shows a sectional view of the TMR element 1 according to the preferred embodiment of the present invention. In this embodiment, the TMR element 1 is provided with a tunnel multilayered film 3 exhibiting a spin tunnel magnetoresistance effect. Specifically, the tunnel multilayered film 3 has a multilayered structure composed of, in a laminate fashion, a tunnel barrier layer 30, a ferromagnetic free layer 20 and a ferromagnetic pinned layer 40 such that the tunnel barrier layer 30 is held between the ferromagnetic free layer 20 and the ferromagnetic pinned layer 40.

In this structure of the tunnel multilayered film 3, a pair of electrodes 75 and 71 are further stacked, directly or indirectly, on the ferromagnetic free layer 20 and the ferromagnetic pinned layer 40 on their sides remote from the tunnel barrier layer 30 for causing a current to flow in a thickness direction (α direction) of the tunnel multilayered film 3. Further, the tunnel multilayered film 3 and the pair of electrodes 75 and 71 are electrically connected.

The ferromagnetic free layer 20 functions as a free layer which can freely change a direction of magnetization in response to an external magnetic field as magnetic information. In addition, the ferromagnetic pinned layer 40 functions as a magnetization fixed layer whose magnetization direction is fixed in one direction. A pinning layer 50 is formed to contact with the ferromagnetic layer 40 for fixing (exchange coupling) the magnetization of the ferromagnetic layer 40.

Specifically, in the embodiment shown in FIG. 1, an under layer 8 is formed between the ferromagnetic free layer 20 and the electrode 71 positioned at the lower side of FIG. 1. Specifically, in the embodiment shown in FIG. 1, the electrode 71, the under layer 8, the ferromagnetic free layer 20, the tunnel barrier layer 30, the ferromagnetic pinned layer 40, the pinning layer 50 and the electrode 75 are stacked, in the order named, on a substrate 5.

Each of the ferromagnetic free layer 20 and the ferromagnetic pinned layer 40 is made preferably of a high spin polarization material, such as Fe, Co, Ni, FeCo, NiFe, CoZrNb or FeCoNi for the purpose of obtaining a high TMR ratio. The thickness of the ferromagnetic free layer 20, which acts as the so called free layer, is set to be 20 Å to 200 Å, preferably 40 Å to 100 Å. An excessive thickness of the layer 20 tends to result in lowering of an output at the time of head operation and, in contrast, if it is thinner than required, magnetic properties become unstable to result in increase of noise at the time of head operation. The thickness of the ferromagnetic pinned layer 40, which acts as the so called magnetized fixed layer (ferromagnetic pined layer), is set to be 10 Å to 50 Å, preferably 20 Å to 30 Å. If the thickness is more than required, the pinning of magnetization by a later-described antiferromagnetic body is weakened and, on the other hand, if it is less than required, the TMR ratio tends to reduce.

Each of the first and second ferromagnetic layers 20 and 40 is not limited to a single layer, and a laminate body in combination of a pair of magnetic layers in antiferromagnetic type magnetic coupling and a non-magnetic metal layer sandwiched therebetween is one of particularly preferable examples. As such a laminate body, a ferromagnetic layer in the form of a three-layered laminate body of CoFe (30 Å in thickness)/Ru (7 Å in thickness)/CoFe (20 Å in thickness) can be cited, for example.

The tunnel barrier layer 30 which is sandwiched between two ferromagnetic layers 20, 40 is made of $Al_2O_3$, NiO, GdO, MgO, $Ta_2O_5$, $MoO_2$, $TiO_2$, $WO_2$ or the like. The thickness of the tunnel barrier layer 30 is desired to be as thin as possible for reducing the resistance of the element. However, if the thickness becomes thin enough to cause pin holes, a leakage current is generated, which is not preferable. In general, the thickness is set to about 5 Å to 20 Å.

The present invention is first characterized by the condition of both surfaces 31 and 32 of the tunnel barrier layer 30. Specifically, as to the surface 31 and 32 of the tunnel barrier layer 30 of the present invention, three indexes representing the surface roughness of the tunnel barrier layer, i.e. (1) center line average roughness Ra, (2) maximum height Rmax, and (3) standard deviation roughness Rrms, are set for satisfying the following conditions.

(1) As to the center line roughness Ra, it is set to be less than or equal to 1 nm, more preferably, it is set to be in the range of 0.001 nm to 1 nm, more preferably, it is set to be in the range of 0.001 nm to 0.8 nm, most preferably, it is set to be in the range of 0.001 nm to 0.6 nm. The lower limit of Ra is desired to be as close to zero as possible, however, in view of the present technique level for smoothing process and the cost for smoothing, the lower limit is set to be about 0.001 nm. The center line average roughness Ra is defined in JIS B 0601. Specifically, the center line average roughness (arithmetical mean deviation of profile) Ra is defined by the following formula (1).

$$Ra = \frac{1}{L} \int_0^L |f(x)| dx \qquad (1)$$

wherein L is the length to be measured in the centerline direction in the surface roughness curve, with the centerline being X axis, and the longitudinal magnification direction being Y axis, and the surface roughness curve is represented by y=f(x).

(2) As to the maximum height Rmax, it is set to be less than or equal to 10 nm, more preferably, it is set to be in the range of 0.01 nm to 10 nm, more preferably, it is set to be in the range of 0.01 nm to 7 nm, most preferably, it is set to be in the range of 0.01 nm to 4 nm. The lower limit of Rmax is desired to be as close to zero as possible, however, in view of the present technique level for smoothing process and the cost for smoothing, the lower limit is set to be about 0.01 nm. The maximum height Rmax is defined in JIS B 0601. Specifically, it is defined as a difference between the maximum value and the minimum value as to the centerline of the cross section. In the present invention, the area for measuring Rmax is all the surface area of the tunnel barrier layer actually used as a head.

(3) As to the standard deviation roughness Rrms, it is set to be less than or equal to 1.2 nm, more preferably, it is set to be in the range of 0.001 nm to 1.2 nm, more preferably, it is set to be in the range of 0.001 nm to 0.8 nm, most preferably, it is set to be in the range of 0.001 nm to 0.6 nm. The lower limit of Rrms is desired to be as close to zero as possible, however, in view of the present technique level for smoothing process and the cost for smoothing, the lower limit is set to be about 0.001 nm. The standard deviation roughness Rrms is, specifically, the standard deviation of Z value of all data, and defined by the following formula (2). The Z value represents the difference between the maximum value and the minimum value as to the center line.

$$Rrms = \sqrt{\frac{\sum (Zi - Zave)^2}{N}} \qquad (2)$$

In the formula (2), N is the number of points in data, Zi is Z value (Z value represents the difference between the maximum value and the minimum value as to the center line) of each data point, and Zave is the average of all Z values.

In the present invention, if the above Ra exceeds 1 nm, Rmax exceeds 10 nm, or Rrms exceeds 1.2 nm, an electrically leakage current tends to occur at the junction portion of the tunnel barrier portion. As a result, the substantial TMR ratio is greatly decreased and the head output is greatly decreased. Of the above three parameters, particularly, Rmax is important. Actually, the size of an element is very small, therefore, in some cases, measurement length may not be long enough. However, in these cases, Rmax most properly represents the surface height differences due to the asperity of the surface which directly affect the characteristics of the element.

For setting the surface roughness of both the surfaces 31 and 32 of the tunnel barrier layer within the range defined in the present invention, the following techniques (i) to (v) are preferably used. These techniques may be used independently or in combination thereof.

(i) Smoothing the surface of the under layer 8 before forming the tunnel multilayered film 3

In this case, a gas cluster ion beam method is preferably used for smoothing the layer. The gas cluster ion beam method is a method in which the gas compressed to about 1 to 5 kg is discharged into the chamber decompressed to about $10^{-4}$ to $10^{-1}$ Torr, thereby generating $10^3$ to $10^6$ gas clusters due to adiabatic expansion, and ionizing the gas clusters, and accelerating the gas clusters by an accelerating electrode at a predetermined voltage, thereby injecting the predetermined number [(dose) $10^5$ to $10^8$] of gas cluster on the wafer to be processed. In this case, by collision between the gas clusters and the wafer to be processed, only protruding portions of the surface of the wafer are abraded, therefore, the wafer is smoothed.

The gas used in the gas cluster ion beam method is selected from Ar, Xe, Kr, Ne, $H_2$, He, and mixtures thereof.

As to the prior art using abrading method, which employs abrasive liquid containing alumina abrasive grain or colloidal silica, it is very difficult to achieve the surface condition defined in the present invention, therefore, it is hard to realize. Further, in view of corrosion of the electrodes and the pinning layer (antiferromagnetic layer), it is not preferable.

(ii) Smoothing the surface of the layer which is exposed at the time just before forming the tunnel barrier layer 30, e.g. the ferromagnetic free layer 20, by the gas cluster ion beam method.

In another embodiment of FIG. 1 wherein the order of lamination of the tunnel multilayered film 3 is reversed, the surface of the ferromagnetic pinned layer 40 is smoothed by the gas cluster ion beam method.

(iii) Selecting layer forming conditions

After preforming an Al single metal layer, the tunnel barrier layer is formed as a barrier layer having a predetermined thickness using a predetermined oxidizing method. In order to obtain the minimum specific resistance and to obtain the smooth surface having the minimum surface roughness, the layer conditions for the tunnel barrier 30 are optimized.

(iv) Forming the electrode 71 and smoothing the surface of the electrode 71 by the gas cluster ion beam method, then, forming the tunnel multilayered film 3.

(v) Forming a shield layer and smoothing the shield layer by the gas cluster ion beam method, then, forming the electrode 71 and the tunnel multilayered film 3.

The under layer 8 of the present invention may be made of a material selected from W, Ta, Rh, Ti, Cr, Mo, Zr, Hf, Pt, Pd, Au, Ag, Cu, or the like, which is set to be about 20 Å to 100 Å in thickness and formed as a thin film.

Further, in the present invention, the pinning layer 50 for pinning the magnetization of the ferromagnetic pinned layer 40 can be made of any material so long as the layer can function as a pinning layer. In general, the pinning layer can be made of an antiferromagnetic material. The thickness of the pinning layer 50 is generally set to be about 60 Å to 300 Å.

Each of the electrodes 71 and 75 is made of a conductive material selected from W, Ta, Rh, Ti, Cr, Mo, Zr, Hf, Pt, Pd, Au, Ag, Cu, or the like. (Magnetic) shield layers of Permalloy etc. can be provided at both outer ends of the electrodes 71 and 75. Further, in the embodiment of FIG. 1, the pinning layer 50 is shown to be positioned at the top side, however, the pinning layer can be positioned at the bottom side. Such a bottom type embodiment is not shown in the drawings, however, in this case, the electrode 71, the under layer 8, the pinning layer 50, the ferromagnetic pinned layer 40, the tunnel barrier layer 30, the ferromagnetic free layer 20, and the electrode 75 are stacked, in the order named, on the substrate 5.

Figure 2:
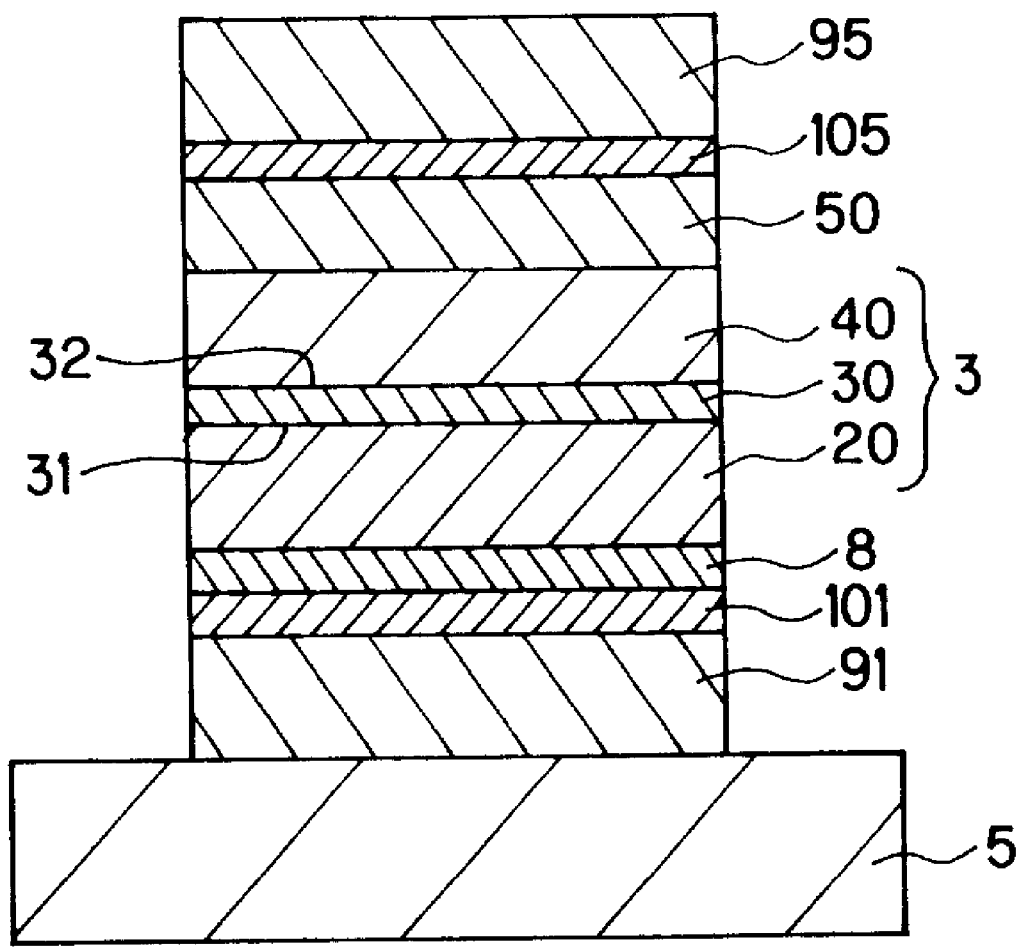
FIG. 2 is a sectional view of a ferromagnetic tunnel magnetoresistance effect element according to another preferred embodiment of the present invention.

FIG. 2 shows a modification of FIG. 1. In FIG. 2, the gap layer 101 is provided on the under layer 8 such that one side of the gap layer 101 contacts with the under layer 8, and the other side of the gap layer 101 is provided thereon with a common lead and shield layer 91. Similarly, the gap layer 105 is provided on the pinning layer 50 such that one side of the gap layer 105 contacts with the pinning layer 50, and the other side of the gap layer 105 is provided thereon with a common lead and shield layer 95. The common lead and shield layers 91 and 95 are each made of NiFe (Permalloy), Sendust, CoFe, CoFeNi or the like. The gap layers 101 and 105 are each made of Cu, Al, Au, Ta, Rh, Cr, In, Ir, Mg, Ru, W, Zn or an alloy thereof. Particularly, the gap layers have functions to adjust the distance between the shields, and to adjust the position of the TMR multilayered film.

FIG. 3 shows the preferred embodiment in which the foregoing tunnel magnetoresistance effect element according to the present invention is applied to a tunnel magnetic head 2 (hereinafter simply referred to as "TMR head 2"). It is noted that the tunnel magnetic head 2 is included in the concept of the tunnel magnetoresistance effect element according to the present invention, thus included in the scope of claims of the present invention.

FIG. 3 is a sectional view of a preferred example of the TMR head 2 according to the present invention. This sectional view corresponds to a surface that is located in a confronting relationship to a magnetic recording medium which produces an external magnetic field as magnetic information. This surface is generally called an ABS (Air Bearing Surface).

In this embodiment, the TMR head 2 has the tunnel multilayered film 3 which exhibits the magneto-resistive spin tunnel magnetoresistance effect. Specifically, the tunnel multilayered film 3 has a laminate structure composed of a tunnel barrier layer 30, a ferromagnetic free layer 20 formed on one surface of the tunnel barrier layer 30, and a ferromagnetic pinned layer 40 formed on the other surface of the tunnel barrier layer 30 so that the tunnel barrier layer 30 is held between the layers 20 and 40. The ferromagnetic free layer 20 can basically change its magnetization direction freely in response to an external magnetic field as magnetic information. On the other hand, the ferromagnetic pinned layer 40 is pinned such that its magnetization direction is entirely fixed in one direction (in FIG. 3, the pinned magnetization direction is in a depth direction of the drawing sheet). Thus, as shown in FIG. 3, a pinning layer 50 for pinning the magnetization of the ferromagnetic pinned layer 40 is stacked on a surface of the ferromagnetic pinned layer 40 remote from a surface thereof abutting the tunnel barrier layer 30.

In the embodiment shown in FIG. 3, on both sides of the tunnel multilayered film 3 in a laminate direction thereof, common lead and shield layers 91 and 95 are electrically contacted for serving both as electrodes for allowing a sense current to flow through the tunnel multilayered film 3 and as magnetic shield layers. By using the common lead and shield layers 91 and 95, a lead gap can be largely reduced and ununiform current flows in the tunnel multilayered film 3 can be prevented. A sense current is supplied to the common lead and shield layers 91 and 95 so that the sense current flows through the tunnel multilayered film 3 in its laminate direction, which is electrically contacted with the common lead and shield layers 91 and 95.

The common lead and shield layers 91 and 95 may be formed so as to be directly contacted with the tunnel multilayered film 3. Alternatively, the common lead and shield layers 91 and 95 may be electrically contacted with the tunnel multilayered film 3 through non-magnetic and conductive gap layers 101 and 105, respectively, as illustrated in the embodiment of FIG. 3.

As described above, the gap layers 101 and 105 have functions to adjust the distance between the shields, to adjust the position of the TMR multilayered film, and to prevent the tunnel current from being ununiform state. Generally, it is preferable to form each gap layer as a single layer, as shown in FIG. 3. However, each gap layer can be formed as a laminate body made of a plurality of materials selected from the materials described above. The thickness of each gap layer 101, 105 is set to be about 50 Å to 700 Å.

The tunnel multilayered film 3 of the present invention is formed via an under layer 8, and the film 3 is preferably formed by the specification shown in FIG. 3. Specifically, the ferromagnetic free layer 20, which constitutes a part of the tunnel multilayered film 3, is formed such that a bias magnetic field (for example, in the direction of arrow α1) is applied in the longitudinal direction of the ferromagnetic free layer 20 by biasing means 61 and 61 which are stacked at longitudinally opposite ends (left and right directions of the drawing paper) of the ferromagnetic free layer 20.

A length $L_f$ in the longitudinal direction (substantially the same as the bias magnetic field applying direction) of the ferromagnetic free layer 20 is set to be greater than a longitudinal length $L_p$ of the ferromagnetic pinned layer 40. The ferromagnetic free layer 20, which is longer than the ferromagnetic pinned layer 40 as described above, has extended portions 20a extending further beyond the longitudinal ends (designated by lines h) of the ferromagnetic pinned layer 40. Each of the extended portions 20a has a length $L_{fe}$ and occupies a part of the ferromagnetic free layer 20, which means that the extended portion 20a is synonymous to a projected length extending further from the end of the ferromagnetic pinned layer 40.

The longitudinal length $L_f$ of the ferromagnetic free layer 20 is set to be in the range of 0.5 μm to 20 μm. The length $L_{fe}$ of the extended portion 20a of the ferromagnetic free layer 20, which is determined in relation to the longitudinal length $L_p$ of the ferromagnetic pinned layer 40, is set to be in the range of 0.1 μm to 5 μm.

The foregoing biasing means 61 and 61 are contacted in a laminate state with the extended portions 20a and 20a at the opposite ends of the ferromagnetic free layer 20. The biasing means 61 and 61 are in exchange coupling to the extended portions 20a and 20a, and the magnetization direction is fixed in the direction shown by arrow α1. Each of the biasing means 61 and 61 is formed such that a predetermined space D is maintained from the corresponding longitudinal end of the ferromagnetic pinned layer 40, as shown in FIG. 3.

The space D is preferably determined, upon determining the head specification, in a predetermined range in order to avoid substantial lowering of TMR ratio characteristics. It is preferable that the specific value is set depending on the head specification, such as materials and dimensions of components to be used. As a preferred example, the space D is set to be no less than 0.02 μm, particularly in the range of 0.02 μm to 0.3 μm, and more preferably, in the range of 0.02 μm to less than 0.15 μm. If the value of D is less than 0.02 μm, the TMR ratio tends to be lowered. In contrast, if the value of D increases to exceed 0.3 μm, an effective track width is unfavorably expanded to result in failure to meet with the requirement of high density recording in the future. If a concentrated attention is paid to the effective track width, the D value is preferably set to be in the range of no less than 0.02 μm to less than 0.15 μm.

With respect to the entire structure of the TMR head 1 shown in FIG. 3, and more particularly to components thereof that have not been explained yet, insulating layers 111,111 and 112, 112 of alumina, as shown in FIG. 3, for example, are externally formed on the opposite ends of the TMR multilayered film, so that the biasing means 61 and 61 are fully insulated from the tunnel barrier layer 30.

Now, the ferromagnetic magneto-resistive tunnel junction effect will be briefly explained. The ferromagnetic magneto-resistive tunnel junction effect is a phenomenon that when a current is applied in the laminate direction between the ferromagnetic layers 20 and 40 sandwiching the tunnel barrier layer 30, a tunnel current flowing in the tunnel barrier layer 30 changes depending on a relative angle of magnetization between the ferromagnetic layers 20 and 40. The tunnel barrier layer 30 is a thin insulation film which allows electrons to pass therethrough while keeping spin due to the magneto-resistive tunnel junction effect. When the ferromagnetic layers 20 and 40 are parallel in magnetization to each other (or a relative magnetization angle therebetween is small), the tunnel probability of electrons is increased and, therefore, the resistance of the current flowing between the ferromagnetic layers 20 and 40 is decreased. In contrast with this, when the ferromagnetic layers 20 and 40 are antiparallel in magnetization to each other (or a relative magnetization angle therebetween is large), the tunnel probability of electrons is lowered so that the resistance of the current flowing therebetween is increased. By utilizing the change in resistance depending on the change in relative magnetization angle, an external magnetic field is detected, for example.

The invention related to the tunnel magnetoresistance effect element (TMR element) described above is more specifically explained with the following specific examples.

Example 1

Ferromagnetic tunnel magnetoresistance effect element samples shown below were prepared. Specifically, each sample was prepared by stacking an electrode layer 71 (Cu; 700 Å in thickness), an under layer (Ta; 100 Å in thickness), a ferromagnetic layer 20 (laminate body of NiFe layer (100 Å in thickness) and CoFe layer (20 Å in thickness)) serving as a free layer, a tunnel barrier layer 30 (aluminum oxide; 10 Å in thickness), a pinned ferromagnetic layer 40 (CoFe; 30 Å in thickness) whose magnetization direction is fixed in a detection magnetic field direction, a pinning layer 50 (RuRhMn; 100 Å in thickness) for pinning magnetization of the ferromagnetic layer 40, and an electrode layer 75 (Ta; 50 Å in thickness), in the order named on a substrate (AlTiC with $Al_2O_3$). The size of each sample was 1 μm×1 μm.

In the samples, the surface roughness of the tunnel barrier layers was changed using the foregoing techniques (i) to (v).

When measuring the surface roughness of the tunnel barrier layer, each sample was sectioned along the laminate direction for clarifying the laminate condition, and the surface roughness was measured using a high resolution transmission electron microscope (TEM) and a scanning secondary electron microscope (S-TEM).

A special pattern for measuring the surface roughness was prepared for measuring the surface roughness, and the measurement was achieved over the area of 10 μm×10 μm.

Generally, the size of the TMR element actually used is about (0.15 μm×0.15 μm) to (1 μm×1 m). Of course, The TMR element actually used as well as the above sample element must satisfy the condition defined in the present invention. In this regard, as the area to be measured increases, the values of Ra, Rmax and Rrms tend to increase.

The TMR ratios (%) were measured in the following manner using the TMR element samples shown in Table 1 below.

TMR Ratio (%)

A constant current was supplied so that a voltage applied to each sample became about 50 mV in a zero magnetic field, then minimum and maximum resistance values Rmin and Rmax were derived from minimum and maximum voltage values, respectively, upon applying a magnetic field of ±900 (Oe), and a TMR ratio (%) was derived from the following equation (1):

$$\text{TMR Ratio (\%)} = [(Rmax - Rmin)/Rmin] \times 100 \quad (1)$$

TABLE 1

| Sample No. | Tunnel barrier layer surface roughness | | | TMR ratio |
| --- | --- | --- | --- | --- |
| | Ra (nm) | Rmax (nm) | Rrms (nm) | (%) |
| 1 | 0.34 | 2.0 | 0.38 | 27.4 |
| 2 | 0.31 | 1.8 | 0.36 | 28.6 |
| 3 | 0.27 | 1.7 | 0.34 | 30.5 |
| 4 | 0.39 | 2.7 | 0.45 | 26.5 |
| 5 | 0.17 | 1.0 | 0.22 | 33.1 |
| 6 | 0.13 | 0.9 | 0.20 | 34.2 |
| 7 | 0.10 | 0.8 | 0.15 | 36.4 |
| 8 | 0.48 | 3.1 | 0.58 | 24.1 |
| 9 | 0.65 | 4.5 | 0.71 | 22.0 |
| 10 | 0.84 | 6.3 | 0.96 | 20.2 |
| 11 (Comparative) | 1.10 | 8.6 | 1.12 | 12.4 |
| 12 (Comparative) | 0.88 | 10.8 | 0.96 | 3.2 |
| 13 (Comparative) | 0.96 | 9.3 | 1.28 | 2.1 |
| 14 (Comparative) | 1.20 | 11.5 | 1.10 | 0.9 |
| 15 (Comparative) | 1.36 | 13.6 | 1.40 | 0.1 |

From the results shown in Table 1, it is understood that the 3 parameters representing the surface roughness must satisfy the condition defined in the present invention for improving the TMR ratio.

As appreciated from the foregoing results, the effect of the present invention is clear. Specifically, the present invention is arranged such that, in a tunnel magnetoresistance effect element comprising a tunnel multilayered film having a tunnel barrier layer, a ferromagnetic free layer and a ferromagnetic pinned layer such that the tunnel barrier layer is held between the ferromagnetic free layer and the ferromagnetic pinned layer, three indexes representing a surface roughness state of the tunnel barrier layer are set such that Ra≦1 nm, Rmax≦10 nm and Rrms≦1.2 nm, wherein Ra is one of the three indexes and representing the center line average roughness, Rmax is one of the three indexes and representing the maximum height, and Rrms is one of the three indexes and representing the standard deviation roughness. Thus, the high TMR ratio and the large head output can be obtained.

What is claimed is:

1. A tunnel magnetoresistance effect element comprising a tunnel multilayered film having a tunnel barrier layer, a ferromagnetic free layer and a ferromagnetic pinned layer such that the tunnel barrier layer is held between the ferromagnetic free layer and the ferromagnetic pinned layer,
   wherein three indexes representing a surface roughness state of the tunnel barrier layer are set such that Ra≦1 nm, Rmax≦10 nm and Rrms≦1.2 nm, wherein Ra is one of the three indexes and representing the center line average roughness, Rmax is one of the three indexes and representing the maximum height, and Rrms is one of the three indexes and representing the standard deviation roughness.

2. The tunnel magnetoresistance effect element according to claim 1, wherein the center line average roughness Ra is set to be in the range of 0.001 nm to 1 nm, the maximum height Rmax is set to be in the range of 0.01 nm to 10 nm, and the standard deviation roughness Rrms is set to be in the range of 0.001 nm to 1.2 nm.

3. The tunnel magnetoresistance effect element according to claim 1, wherein said tunnel magnetoresistance effect element comprises said ferromagnetic free layer, said tunnel barrier layer, said ferromagnetic pinned layer and a pinning layer for pinning magnetization of said ferromagnetic pinned layer, which are stacked, in the order named, on an under layer formed on a substrate.

4. The tunnel magnetoresistance effect element according to claim 1, wherein said tunnel magnetoresistance effect element comprises a pinning layer for pinning magnetization of said ferromagnetic pinned layer, said ferromagnetic pinned layer, said tunnel barrier layer and said ferromagnetic free layer, which are stacked, in the order named, on an under layer formed on a substrate.

5. The tunnel magnetoresistance effect element according to claim 1, wherein the surface of one of said layers which have been formed before forming said tunnel barrier layer is smoothed by a gas cluster ion beam method.

6. The tunnel magnetoresistance effect element according to claim 1, wherein, before forming said tunnel barrier layer, the surface of an under layer is smoothed by a gas cluster ion beam method.

7. The tunnel magnetoresistance effect element according to claim 1, wherein a bias magnetic field is applied to said ferromagnetic free layer in a longitudinal direction thereof by biasing means provided at both ends of said ferromagnetic free layer in the longitudinal direction thereof.

8. The tunnel magnetoresistance effect element according to claim 1, wherein said ferromagnetic free layer is a synthetic ferrimagnet.

9. The tunnel magnetoresistance effect element according to claim 1, wherein said ferromagnetic pinned layer is a synthetic ferrimagnet.

10. The tunnel magnetoresistance effect element according to claim 1, wherein said tunnel multilayered film is electrically connected to a pair of electrodes which are oppositely positioned to sandwich said tunnel multilayered film therebetween.

11. The tunnel magnetoresistance effect element according to claim 10, wherein a pair of shield layers are oppositely positioned to sandwich said pair of electrodes therebetween.

12. A magnet-resistive tunnel junction head comprising a tunnel magnetoresistance effect element which includes a tunnel multilayered film having a tunnel barrier layer, a ferromagnetic free layer and a ferromagnetic pinned layer such that the tunnel barrier layer is held between the ferromagnetic free layer and the ferromagnetic pinned layer, wherein three indexes representing a surface roughness state of the tunnel barrier layer are set such that Ra≦1 nm, Rmax≦10 nm and Rrms≦1.2 nm, wherein Ra is one of the three indexes and representing the center line average roughness, Rmax is one of the three indexes and representing the maximum height, and Rrms is one of the three indexes and representing the standard deviation roughness.

13. The magnet-resistive tunnel junction head according to claim 12, wherein the center line average roughness Ra is set to be in the range of 0.001 nm to 1 nm, the maximum height Rmax is set to be in the range of 0.01 nm to 10 nm, and the standard deviation roughness Rrms is set to be in the range of 0.001 nm to 1.2 nm.

14. The magnet-resistive tunnel junction head according to claim 12, wherein said tunnel magnetoresistance effect element comprises said ferromagnetic free layer, said tunnel barrier layer, said ferromagnetic pinned layer and a pinning layer for pinning magnetization of said ferromagnetic pinned layer, which are stacked, in the order named, on an under layer formed on a substrate.

15. The magnet-resistive tunnel junction head according to claim 12, wherein said tunnel magnetoresistance effect element comprises a pinning layer for pinning magnetization of said ferromagnetic pinned layer, said ferromagnetic pinned layer, said tunnel barrier layer and said ferromagnetic free layer, which are stacked, in the order named, on an under layer formed on a substrate.

16. The magnet-resistive tunnel junction head according to claim 12, wherein the surface of one of said layers which have been formed before forming said tunnel barrier layer is smoothed by a gas cluster ion beam method.

17. The magnet-resistive tunnel junction head according to claim 12, wherein, before forming said tunnel barrier layer, the surface of an under layer is smoothed by a gas cluster ion beam method.

* * * * *